United States Patent [19]

Sakamoto et al.

[11] 3,872,392

[45] Mar. 18, 1975

[54] CASCADE DIRECT-COUPLED AMPLIFIER

[75] Inventors: Yoshio Sakamoto; Shinsuke Iguchi, both of Tokyo, Japan

[73] Assignee: Hitachi, Ltd., Tokyo, Japan

[22] Filed: July 26, 1973

[21] Appl. No.: 382,693

[30] Foreign Application Priority Data

July 6, 1972 Japan ................................ 47-74178

[52] U.S. Cl. ........................ 330/19, 330/22, 330/25, 330/28, 330/40

[51] Int. Cl. ................................................ H03f 3/04

[58] Field of Search .............. 330/19, 22, 25, 28, 40

[56] References Cited

UNITED STATES PATENTS 3,424,992 1/1969 Zielinski et al. .................. 330/22 X 3,750,040 7/1973 Weir ................................ 330/25 X

*Primary Examiner*—John Kominski

*Assistant Examiner*—Lawrence J. Dahl

*Attorney, Agent, or Firm*—Craig & Antonelli

[57] ABSTRACT

A cascade direct-coupled amplifier comprising a current-absorbing circuit whose absorption current increases or decreases in proportion to an increase or decrease in the supply voltage of the amplifier, thereby to make the dynamic range of the amplifier wide.

8 Claims, 2 Drawing Figures

CASCADE DIRECT-COUPLED AMPLIFIER

BACKGROUND OF THE INVENTION

1. Field of the Invention

This invention relates to a cascade direct-coupled amplifier circuit, and more particularly to an amplifier circuit which is suitable to manufacture in the form of a semiconductor integrated circuit device.

2. Description of the Prior Art

In a linear amplifier circuit employing transistors, the DC potential of the output terminal should be proportional to the supply voltage in order to raise the utilization factor of the supply voltage.

In the linear amplifier circuit assembled into a semiconductor integrated circuit device, or assembled by the use of separate elements, various circuit constants are fixed. In the case of operating such a circuit by a power source intense in the regulation of the supply voltage or by a power source of arbitrary voltage values, it has been unavoidable to considerably alter the electrical characteristics of the circuit.

In a semiconductor integrated circuit device for amplifying voice signals, it is desirable that the normal operation is effected for supply voltages of a wide range of from several volts to several tens of volts. A linear amplifier sufficient to fulfill such a desire, however, has not heretofore been provided.

A prior-art amplifier circuit has been provided, for example, in which the first grounded-emitter transistor and the second groundedemitter transistor are connected in direct-coupled cascade, and a bias current is fed from the emitter of the second transistor to the base of the first transistor. Such an amplifier has a low noise characteristic, is thermally stable, and has a high utilization factor of the power supply at a specified supply voltage. In case the supply voltage is varied from the specified value, however, the utilization factor of the supply voltage lowers. This is ascribable to the fact that the emitter current of the first transistor is a comparatively small current, while the DC feedback is applied from the emitter of the second transistor to the base of the first transistor to thereby bring the base of the first transistor to a fixed voltage, whereby the collector current of the second transistor biasing the first transistor is brought to a fixed voltage. With the above circuit, when the supply voltage is changed, the value of the DC voltage drop in the collector load circuit of the second transistor and the collector - emitter voltage thereof become unequal.

In contrast, a linear amplifier circuit constructed by connecting in cascade a plurality of differential circuits having emitters commonly connected is advantageous in that even when the supply voltage is varied, the operating point is retained at an appropriate value. The amplifier circuit, however, has such disadvantages that the number of constituent elements is large and large noises are produced.

SUMMARY OF THE INVENTION

It is accordingly an object of this invention to provide an amplifier circuit which always operates at the optimum operating point, even when the supply voltage varies.

Another object of this invention is to provide an amplifier circuit having a low noise characteristic.

Still another object of this invention is to provide an amplifier circuit which is suitable for a semiconductor integrated circuit device.

In accordance with this invention, there is provided a cascade direct-coupled amplifier circuit having a first grounded-emitter transistor, a second grounded-emitter transistor which is connected DCwise to the first transistor, and a bias circuit which supplies a bias current from an emitter of the second transistor to a base of the first transistor, characterized in that a current absorbing circuit whose absorbing current varies in proportion to the supply voltage is connected to the emitter of the second transistor.

DESCRIPTION OF THE PREFERRED EMBODIMENTS

Figure 1:
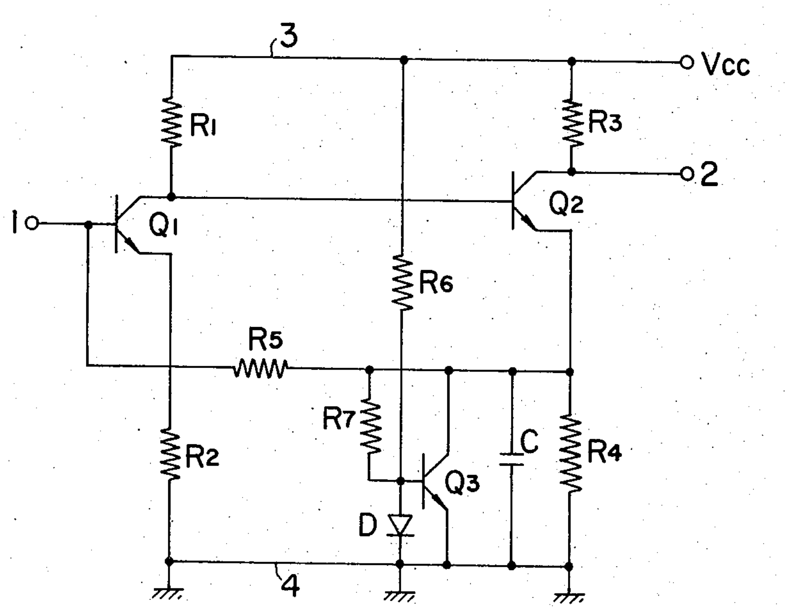
FIG. 1 is a schematic circuit diagram of an embodiment of a cascade direct-coupled amplifier according to this invention.

FIG. 1 shows a circuit arrangement of a two-stage cascade direct-coupled amplifier embodying the present invention. A signal input terminal 1 is connected to the base of a grounded-emitter N-P-N transistor $Q_1$. The collector of the transistor $Q_1$ is connected to a power source line 3 through a load resistance $R_1$, and the emitter of the transistor $Q_1$ is connected to a ground line 4 through an emitter feedback resistance $R_2$.

The collector of the transistor $Q_1$ is connected to the base of a grounded-emitter N-P-N transistor $Q_2$. The collector of the transistor $Q_2$ has an output terminal 2 connected thereto, and is connected to the power source line 3 through a load resistance $R_3$. Between the emitter of the transistor $Q_2$ and the ground line 4, there is provided a parallel circuit consisting of a resistance $R_4$ and a capacitor C. A voltage appearing across the parallel circuit is fed back to the base of the transistor $Q_1$ through a resistance $R_5$.

To the emitter of the transistor $Q_2$, the collector of an N-P-N transistor $Q_3$ is connected. The emitter of the transistor $Q_3$ is connected to the ground line 4. The base of the transistor $Q_3$ is connected to the power source line 3 through a resistance $R_6$, and is grounded through a diode D in the forward direction thereof. Across the collector and base of the transistor $Q_3$, a resistance $R_7$ is connected in parallel.

In the above circuit, the emitter current of the transistor $Q_1$ is at a comparatively small value, so that the base-emitter voltage $V_{BE}$ of the transistor $Q_1$ is made substantially constant. Besides, the base potential of the transistor $Q_1$ is made substantially constant irrespective of the value of the supply voltage by means of a DC stabilizing negative-feedback circuit constructed along a path including the collector of the transistor $Q_1$, the base of the transistor $Q_2$, the emitter of the transistor $Q_2$, the resistance $R_5$ and the base of the transistor $Q_1$.

Accordingly, the emitter potential of the transistor $Q_2$, which biases the transistor $Q_1$, is also made substantially constant independent of the value of the supply voltage. Consequently, in the case where the transistor $Q_3$ is not in the circuit, that component of the emitter current of the transistor $Q_2$ which flows through the emitter feedback resistance $R_4$, namely, a collector current roughly equal to the aforesaid emitter current, becomes roughly constant. Since, as previously stated, the voltage drop of the resistance $R_3$ due to the current flowing through the resistance $R_4$ is constant, the output terminal 2 has its voltage raised by any component rise of the supply voltage. For this reason, in the case where the supply voltage is increased or decreased, the utilization factor of the supply voltage becomes unsatisfactory.

The circuit composed of the transistor $Q_3$, the diode D and the resistance $R_6$ serves to enhance the voltage utilization factor.

The base-emitter, voltage-current characteristics of the transistor $Q_3$ and the forward voltage-current characteristic of the diode D are substantially similar in their characteristic non-linearity, so that the collector current of the transistor $Q_3$ biased by the diode D and the forward current of the diode are substantially in direct proportion. Since, on the other hand, the forward voltage of the diode D is significantly smaller than the supply voltage, the current which flows through the diode D is substantially determined by the resistance $R_6$ and the supply voltage and varies substantially in direct proportion to the supply voltage in spite of the fact that the diode exhibits some non-linearity. In consequence, in the case where the supply voltage increases, the collector absorption current of the transistor $Q_3$ of the current absorbing circuit increases in proportion to the supply voltage. As a result, the emitter current of the transistor $Q_2$, and accordingly the collector current which is approximately equal thereto, increases correspondingly, and the voltage drop across the load resistance $R_3$ becomes larger.

Similarly, in the case where the supply voltage decreases, the voltage drop across the resistance $R_3$ becomes smaller in proportion to the supply voltage. As the result of these operations, the DC level appearing at the output terminal 2, or the bias value, varies in proportion to the supply voltage, which makes it possible to provide a two-stage cascade direct-coupled amplifier having desirable increase-and-decrease characteristics. The DC potential of the output terminal 2 is thus always maintained at about one-half of the supply voltage, whereby the electric power is effectively used and yet the dynamic range can be set to a wide value.

The resistance $R_7$ connected between the emitter of the transistor $Q_2$ and one terminal of the diode D serves to raise the open gain of the circuit, namely, the gain of the circuit at the time when no negative feedback is applied to the circuit. More specifically, the use of the resistance $R_7$ sufficiently lowers the impedance of the circuit connected to the emitter of the transistor $Q_2$. The amount of feedback to the emitter of the transistor $Q_2$ and the amount of feedback to the base of the transistor $Q_1$ are accordingly reduced, to raise the open gain. In the above circuit, a major portion of the voltage between the emitter of the transistor $Q_2$ and the ground line 4 is consumed by the diode D or the base-emitter circuit of the transistor $Q_3$. The voltage drop across the resistance $R_7$ is consequently made remarkably small, so that the current through the resistance $R_7$ is remarkably small. Accordingly, the resistor $R_7$ can be set at a resistance value sufficiently lower than that of the resistor $R_4$. Besides, the use of the resistance $R_7$ does not change the operating point of the circuit in an undesirable manner.

Figure 2:
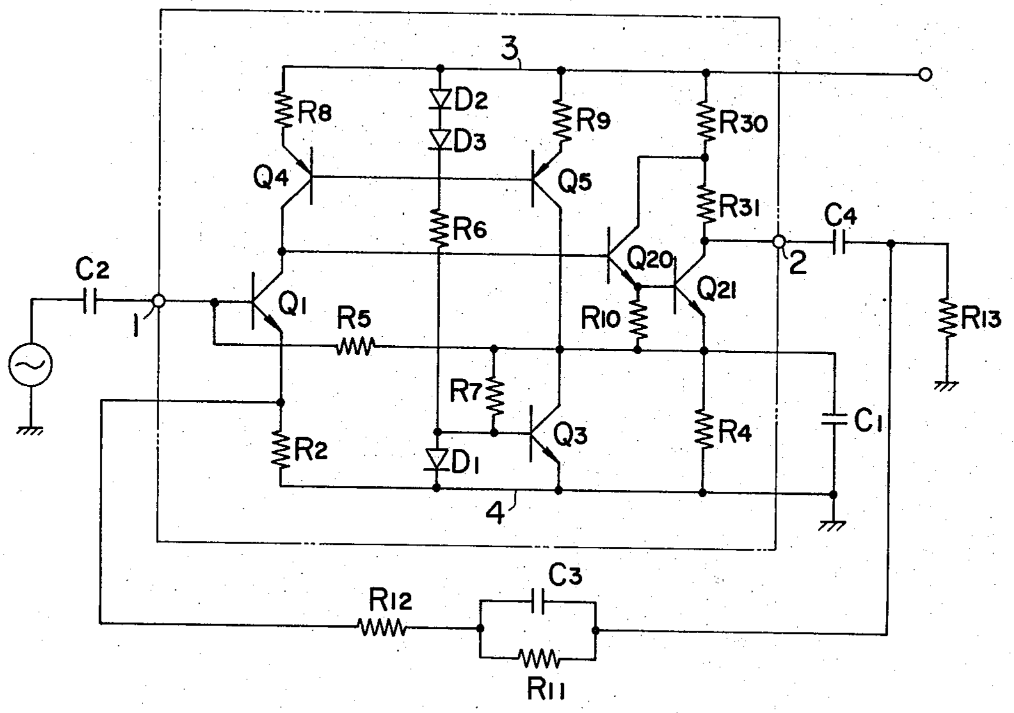
FIG. 2 is a schematic circuit diagram of another embodiment of the amplifier of this invention.

FIG. 2 shows another embodiment of the cascade direct-coupled amplifier according to the present invention, representing a further improved version. Reference numeral 1 designates an input terminal. A signal coming thereto is amplified by an N-P-N transistor $Q_1$ at the first stage, the amplified signal is further amplified by N-P-N transistors $Q_{20}$ and $Q_{21}$ at the second stage, and this amplified signal appears at an output terminal 2. A capacitor $C_1$ arranged in parallel with an emitter feedback resistance $R_4$ of the transistors $Q_{20}$ and $Q_{21}$ is incorporated in order to raise the open loop gain of the circuit. A circuit consisting of diodes $D_2$ and $D_3$, a resistance $R_9$ and a P-N-P transistor $Q_5$ is provided for obtaining a constant current. The circuit arrangement is so provided that a current from this circuit, namely, the collector current of the transistor $Q_5$, is supplied to the resistance $R_4$.

The above-mentioned current is substantially equal to the current flowing through the resistance $R_4$. Therefore, a major portion of the emitter current of the transistors $Q_{20}$ and $Q_{21}$ is caused to flow into the collector of the transistor $Q_3$.

The transistor $Q_3$, a diode $D_1$ and a resistance $R_6$ are provided as a constant-current circuit which is used for the same purpose as in the previous embodiment. The collector current of the transistor $Q_3$ increases and decreases substantially in direct proportion to the supply voltage.

Thus, according to the circuit of this embodiment, a current substantially corresponding to the value of the collector current of the transistor $Q_3$ flows through the transistors $Q_{20}$ and $Q_{21}$. The voltage drops of load resistances $R_{30}$ and $R_{31}$ increase and decrease more proportionally to the increase and decrease of the supply voltage than in the previous embodiment.

A constant-current circuit consisting of a P-N-P transistor $Q_4$, a resistance $R_8$ and the diodes $D_2$ and $D_3$ is provided as a constant-current load for the N-P-N transistor $Q_1$, and raises the gain of the circuit.

The cascade direct-coupled amplifier according to the present invention, as has thus far been described, has various merits. Since it is a direct-coupled amplifier, it has good noise characteristics. Since the current absorbing circuit is provided, the increase or decrease voltage characteristics are good. With a single circuit, it is possible to set a dynamic range which is sufficient for changes or alternations of the supply voltage over, for example, 3.5 volts to 30 volts. Since it is a cascade direct-coupled amplifier, the number of pin terminals externally attached to the circuit may be small when the circuit is put into the form of an integrated circuit, in contrast to the case of a differential amplifier. Further, since the constant current of the emitter feedback circuit is cancelled by means of the constant-current circuit, the increase and decrease voltage characteristics are extremely good.

While we have shown and described two embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What we claim is:

1. In a cascade direct-coupled amplifier having a supply voltage source, a first grounded-emitter transistor connected to said supply voltage source, a second grounded-emitter transistor which is connected DC-wise to said first transistor and to said supply voltage source, and a bias circuit which supplies a bias current from the emitter of said second transistor to the base of said first transistor, the improvement comprising current absorbing circuit means for providing an absorption current which varies in proportion to changes in said supply voltage source and which is connected to said emitter of said second transistor, said current absorbing circuit means including a third grounded-emitter transistor having its collector connected to the emitter of said second grounded-emitter transistor, and a resistor and a diode connected in series between said supply voltage source and ground, the base of said third transistor being connected to the point of connection of said resistor and said diode.

2. A cascade direct-coupled amplifier as defined in claim 1, wherein a further resistor is connected between the base and collector of said third transistor.

3. A cascade direct-coupled amplifier as defined in claim 2, wherein said bias circuit comprises a feed-back resistor connected between the emitter of said second transistor and the base of said first transistor.

4. A cascade direct-coupled amplifier comprising a supply voltage source, a first transistor having its emitter connected to ground through a first resistor and its collector connected to said supply voltage source, second and third transistors, the base of said second transistor being connected to the collector of said first transistor, the emitter of said second transistor being connected to the base of said third transistor and through a second resistor to the emitter of said third transistor, a parallel circuit of a capacitor and a third resistor connected between the emitter of said third transistor and ground, fourth and fifth resistors connected in series between the collector of said third transistor and said supply voltage source, the collector of said second transistor being connected to the point of connection of said fourth and fifth resistors, a bias circuit which supplies a bias current from the emitter of said third transistor and the base of said first transistor, a fourth transistor having its collector connected to the emitter of said third transistor and its emitter grounded, and a sixth resistor and a diode connected in series between said supply voltage source and ground, the base of said fourth transistor being connected to the point of connection of said sixth resistor and said diode.

5. A cascade direct-coupled amplifier as defined in claim 4, wherein a seventh resistor is connected between the base and collector of said fourth transistor.

6. A cascade direct-coupled amplifier as defined in claim 5, wherein said bias circuit comprises an eighth resistor connected between the emitter of said third resistor and the base of said first resistor.

7. A cascade direct-coupled amplifier as defined in claim 5, further including a fifth transistor and a ninth resistor connected in series between the collector of said first transistor and said supply voltage source, and a sixth transistor and tenth resistor connected in series between the collector of said fourth transistor and said supply voltage source, the bases of said fifth and sixth transistors being connected together.

8. A cascade direct-coupled amplifier as defined in claim 7, wherein a pair of additional diodes are connected in series between said sixth resistor and said supply voltage source.

* * * * *